United States Patent [19]
Inomoto

[11] Patent Number: 5,811,838
[45] Date of Patent: Sep. 22, 1998

[54] ELECTRO-ABSORPTION TYPE SEMICONDUCTOR OPTICAL MODULATOR

[75] Inventor: Yasumasa Inomoto, Tokyo, Japan

[73] Assignee: NEC Corporation, Tokyo, Japan

[21] Appl. No.: 608,332

[22] Filed: Feb. 28, 1996

[30] Foreign Application Priority Data

Feb. 28, 1995 [JP] Japan ..................................... 7-040178

[51] Int. Cl.⁶ .................................................. H01L 27/15
[52] U.S. Cl. .............................. 257/80; 257/84; 257/101; 257/103; 257/184; 372/50
[58] Field of Search ................................. 257/13, 21, 80, 257/82, 94, 96, 101, 103, 84; 372/50, 45, 46

[56] References Cited

U.S. PATENT DOCUMENTS 5,679,603  10/1997  Kimura et al. ............................. 438/31

FOREIGN PATENT DOCUMENTS 4-303982  10/1992  Japan .

*Primary Examiner*—Minh-Loan Tran
*Attorney, Agent, or Firm*—Foley, Hoag & Eliot, LLP

[57] ABSTRACT

A semiconductor optical device includes, a monolithically integrated electro-absorption type optical modulator and a light source. A striped light-absorbing layer is formed on an n-type InP substrate, an i-type InP burying layer is formed on both sides of the striped light-absorbing layer, and a p-type burying layer is formed so as to cover the light-absorbing layer and the i-type InP layer. The i-type InP layer underlying the burying layer reduces the capacitance of the pn junction between the burying layer and the n-type InP substrate remarkably to enable the high-speed modulating operation of the semiconductor electro-absorption type optical device. The semiconductor optical device is fabricated by; forming two masking stripes of silicon oxide on the surface of an n-type InP substrate, forming a double heterostructure layer consisting of an n-type InP cladding layer, a p-type InP cladding layer and a light-absorbing layer interposed between the n-type and the p-type InP cladding layer, removing the respective inner edge portions of the two masking stripes, and forming a burying layer consisting of an i-type InP layer and a p-type InP layer.

12 Claims, 4 Drawing Sheets

ELECTRO-ABSORPTION TYPE SEMICONDUCTOR OPTICAL MODULATOR

BACKGROUND OF THE INVENTION

1. Field of the Invention

The present invention relates to a semiconductor optical device for optical communication and, more specifically, to a high-speed semiconductor electro-absorption type optical modulator, a semiconductor electro-absorption type optical modulator monolithically integrated with a light source, and methods of fabricating such a semiconductor electro-absorption type optical modulators.

2. Description of the Related Art

With the progress of optical fiber communication technology, extensive efforts are being made for the development of optical transmission systems having an increased transmission capacity and capable of longer-distance transmission. An optical transmission system utilizing a direct modulation type semiconductor laser that modulates the semiconductor laser itself directly is being currently applied to commercial use. This known direct optical modulation varies the injection current injected into an active layer, which entails chirping, i.e., the fluctuation of the wavelength of the laser beam, due to the variation of the refractive index. On the other hand, for longer-distance transmission, the use of a laser beam in the 1.55 $\mu$m band instead of a laser beam in the 1.3 $\mu$m band is effective due to reduced transmission loss caused by optical fibers. However, when a laser beam in the 1.55 $\mu$m band is used for transmitting signals at a transmission rate on the order of Gbps (gigabits per second) using the existing optical fibers that are not compensated for wavelength dispersion, the sensitivity at the receiving side is deteriorated by wavelength dispersion due to the aforementioned chirping. This problem is an impediment to the enhancement of transmission capacity and the extension of transmission distance when one is to use existing optical transmission lines.

A method of suppressing the chirping of a laser beam by dc-driving a laser and modulating the intensity of the laser beam by an external modulator has been proposed to solve such a problem and has become widely noticed in recent years. The development of an external semiconductor modulator of an electro-absorption type is greatly hoped for owing to its advantages in miniaturization, assembling feasibility and possibility of integration with a semiconductor laser.

A technique of forming an optical waveguide in a region between two growth blocking asks using a selective MOVPE (metal organic vapor phase epitaxial) growth process, which is capable of controlling the band gap along the waveguide direction and of forming low-loss waveguide, is a prospective technique of fabricating optoelectronic integrated devices. An optical modulator fabricated by this kind of technique is disclosed in, for example, JP-A No. 4-30398. Namely, a trapezoidal double heterostructure layer (DH layer) is deposited in a region between two growth blocking masks by a selective MOVPE growth process, portions of the growth blocking masks on the opposite sides of the DH layerare removed, wherein cladding layers are deposited.

FIGS. 5A to 5C illustrates this known optical modulator in different phases of fabrication. When fabricating this optical modulator, two masking stripes 31 made of silicon oxide are formed with a spacing of 1.8 $\mu$m on the surface of an n-type InP substrate 30. A 500 Å thick n-type InP cladding layer, an MQW active layer and a 500 Å thick p-type InP cladding layer are formed in the region between the two masking stripes 31 by a selective MOVPE growth process to construct a trapezoidal DH layer 32 which serves as a waveguide region (FIG. 5A). 2 $\mu$m wide portions of the masking stripes 31, contiguous with the waveguide region are removed to partially expose the surface of the n-type InP substrate 30. A p-type InP layer 33 is formed so as to embed the exposed portions of the type InP substrate 30 and the DH layer 32, and a p-type InGaAs contact layer 35 is formed on the top surface of the p-type InP layer 33 as shown in FIG. 5B. Thereafter, a structure as shown in FIG. 5C is completed.

In order to enable an optical modulator to operate at a high operating speed, reduction of device capacitance is essential. However, the known optical modulator of a structure as shown in FIG. 5C has a large parasitic capacitance and hence it is difficult for the optical modulator to operate at a high speed on the order of Gbps. Shown also in FIGS. 5A to 5C are a silicon oxide layer 36, a p-side electrode 37, an n-side electrode 38 and an anti-reflective film 39.

SUMMARY OF THE INVENTION

Accordingly, it is an object of the present invention to provide a high-speed electro-absorption type semiconductor optical modulator, and a method of fabricating such a semiconductor electro-absorption type optical modulator. Another object of the present invention is to provide a semiconductor optical device having a semiconductor electro-absorption type optical modulator monolithically integrated with a light source, and a method of fabricating such a semiconductor optical device.

A semiconductor electro-absorption type optical modulator in accordance with the present invention is provided with a lightly doped n-type burying layer formed contiguously with the side surfaces of a light-absorbing layer formed on an n-type InP substrate.

A method of fabricating this semiconductor electro-absorption type optical modulator comprises steps of forming two masking stripes of silicon oxide on the surface of an n-type InP substrate, forming a DH layer consisting of an n-type InP cladding layer, a p-type InP cladding layer and a light-absorbing layer sandwiched between the n-type and the p-type InP layer by an MOVPE growth process in a region between the two masking stripes so that the p-type InP layer has a triangular cross section, removing the respective inner edge portions of the two masking stripes, and forming a burying layer consisting of an i-type InP layer and a p-type InP layer.

A semiconductor optical device in accordance with the present invention having a semiconductor electro-absorption type optical modulator monolithically integrated with a laser comprises an n-type InP substrate, a light-absorbing layer formed on the InP substrate, a light-emitting layer formed on the InP substrate, and a burying layer covering the side surfaces of the light-absorbing layer and the light-emitting layer; wherein the light-absorbing layer and the light-emitting layer are lightly doped layers of the same conductivity type as that of the burying layer.

A method of fabricating this semiconductor optical device comprises steps of forming two masking stripes of silicon oxide on the surface of an n-type InP substrate, forming a DH layer consisting of an n-type InP clad layer, a p-type InP clad layer and a light-absorbing layer sandwiched between the n-type and the p-type InP clad layer by an MOVPE growth process in a region between the two masking stripes so that the p-type InP layer has a triangular cross section, removing the respective inner edge portions of the two masking stripes, and forming a burying layer consisting of an i-type InP layer and a p-type InP layer.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENTS

Figure 1A:
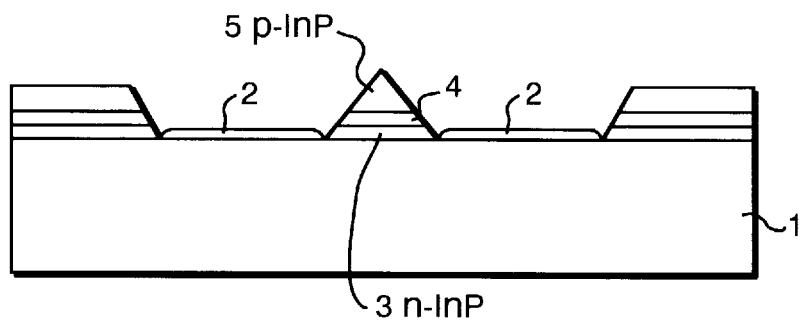
FIGS. 1A and 1B are sectional views for assistance in explaining a method of fabricating a semiconductor electro-absorption type optical modulator in a first embodiment according to the present invention.

A semiconductor electro-absorption type optical modulator and a method of fabricating such a modulator will be described with reference to FIGS. 1 and 2, as a first embodiment according to the present invention. Referring to FIG. 1, a 150 nm thick silicon oxide film is deposited on an (100) surface of an n-type InP substrate by a thermal CVD process, and then the silicon oxide film is processed by an ordinary photo-lithographic wet etching process to form a pair of 8 μm wide silicon oxide masking stripes 2 oriented in the <011> direction and spaced apart by 1.5 μm. Then, a DH layer as shown in FIG. 1A is formed by sequentially growing a 0.1 μm thick n-type InP cladding layer 3 having a carrier concentration of $5 \times 10^{17}$ cm$^{-3}$, a 0.2 μm thick undoped i-type InGaAsP light-absorbing layer 4 having an 1.46 μm wavelength composition, and a p-type InP cladding layer 5 having a carriere concentration of $5 \times 10^{17}$ cm$^{-3}$ in that order using a selective MOVPE, growth process at a growth pressure of 75 torr and a growth temperature of 625° C. The selective MOVPE growth process is continued until the growth of the p-type InP cladding layer 5 stops. Since virtually no film grows on the (111)B surface, i.e., the side facets of the DH layer, the growth of the p-type InP cladding layer 5 stops when the p-type cladding layer 5 is formed in a triangular cross section. In the MOVPE growth, the undoped layer is of an n-type conductivity.

Figure 1B:
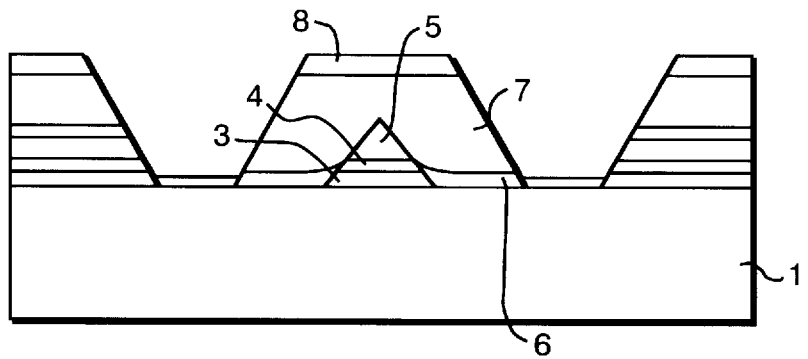
Figure 2:
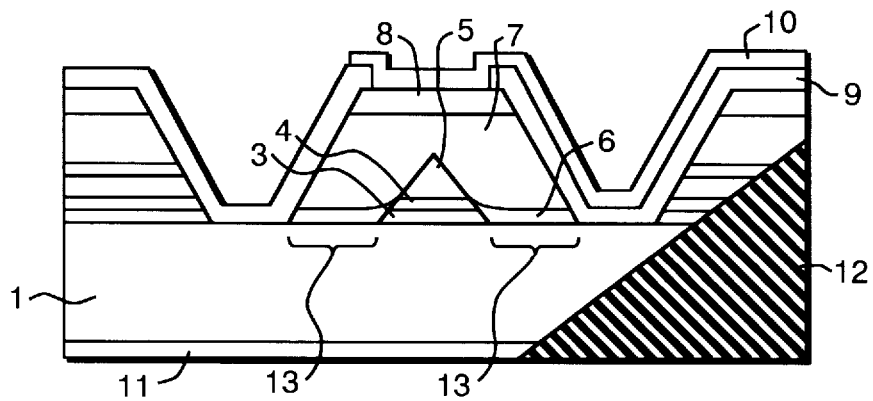
FIG. 2 is a sectional view of the semiconductor electro-absorption type optical modulator in the first embodiment.

Next, the distance between the masking stripes 2 is increased by 5 μm by an ordinary photolithographic wet etching process, and then MOVPE growth processes are carried out to grow an undoped 0.3 μm thick i-type InP layer 6, a 1.8 μm thick p-type InP burying layer 7 of $5 \times 10^{17}$ cm$^{-3}$ carrier concentration, and a 0.2 μm thick p-type InGaAs contact layer 8 of $5 \times 10^{18}$ cm$^{-3}$ carrier concentration as shown in FIG. 1B. When growing the i-type InP layer 6, growth starts only on the (100) surface, and growth on the (111)B surface starts from the bottom with the progress of growth on the (100) surface. Therefore, he i-type InP layer 6 does not grow around the apex of the triangular cross section. The p-type InP layer 7 is formed in a trapezoidal cross section and covers the DH layer completely. Then, a 350 nm thick silicon oxide film 9 is formed by a thermal CVD process over the entire surface of the workpiece, a contact opening is formed in the silicon oxide film 9 by an ordinary photo-lithographic wet etching process, a 100 nm thick Ti film and a 300 nm thick Au film are deposited by sputtering processes, and then the Ti and Au film are processed by an ordinary photolithographic wet etching process to form a p-side pad electrode 10. Then, the back side of the substrate 1 is lap polished to adjust the thickness of the substrate 1 to 100 μm, a 100 nm thick Ti film and a 300 nm thick Au film are deposited by sputtering processes to form an n-side electrode 11, after which the workpiece is sintered at 430° C. in a nitrogen atmosphere. Then, the workpiece is cleaved to an element length of 300 μm, and a silicon nitride anti-reflective film 12 is sputter deposited on the cleaved surfaces to complete a semiconductor electro-absorption type optical modulator shown in FIG. 2.

In the above described structure, a p-i-n structure rather than a p-n junction structure is formed at the sides of the DH layer. The 0.3 μm thick i-type InP layer 6 inserted under the burying layer 7 and the substrate 1 remarkably reduces the capacitance of the pn junction 13 between the burying layer 7 and the substrate 1. Experiments showed that the device capacitance of the semiconductor electro-absorption type optical modulator is 2 pF or below when biased by a bias voltage of 0 V, while that of the equivalent known art optical modulator is 4 pF. This semiconductor electro-absorption type optical modulator showed satisfactory response characteristics under modulation at 2.4 Gbps. The number of crystal growth processes required by the method of fabricating the semiconductor electro-absorption type optical modulator in this embodiment is equal to that required by a method of fabricating the equivalent known art optical modulator while in the present invention, the cross sectional shape of the DH layer is controlled automatically. Thus, the semiconductor electro-absorption type optical modulator of this embodiment is excellent in fabrication controllability and reproducibility.

A semiconductor optical device integrally comprising a semiconductor electro-absorption type optical modulator and a DFB laser and a method of fabricating the same will be described with reference to FIGS. 3 and 4 as a second embodiment according to the present invention.

Figure 3A:
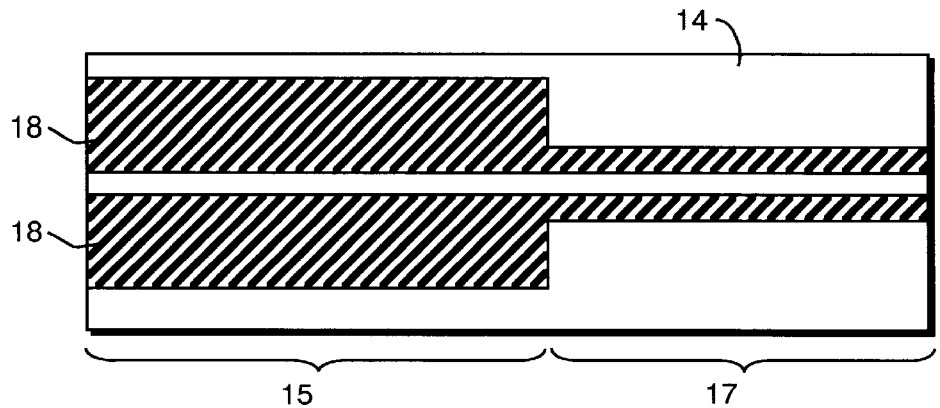
FIGS. 3A, 3B, 3C, 3D and 3E are sectional views for assistance in explaining a semiconductor optical device integrally comprising a semiconductor electro-absorption type optical modulator and a DFB (distributed feedback) laser, in a second embodiment according to the present invention.

Referring to FIGS. 3A–3E, a diffractive grating 16 having a period of 241.7 nm in the <011> direction is provided in a laser section 15 of a (100) n-type InP substrate 14 by an interference-exposure and a wet etching process. Then, a 150 nm thick silicon oxide film, is deposited over the surface of the workpiece by a thermal CVD process. The silicon oxide film is processed by an ordinary photo-lithographic wet etching process to form in the <011> direction, a pair of silicon oxide masking stripes 18 spaced apart by 1.5 μm, Each masking stripe has a 18 μm wide 500 μm long portion corresponding to the laser section 15 and a 5 μm wide 200 μm long portion corresponding to the modulator section 17 as shown in FIG. 3A.

Figure 3B:
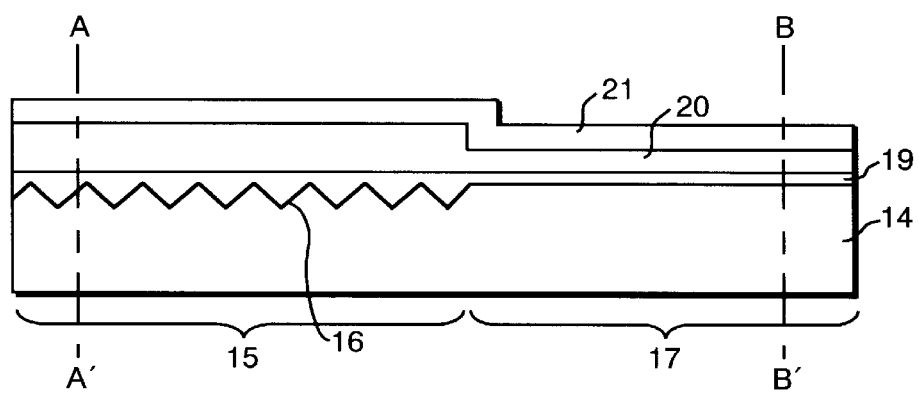
Figure 3C:
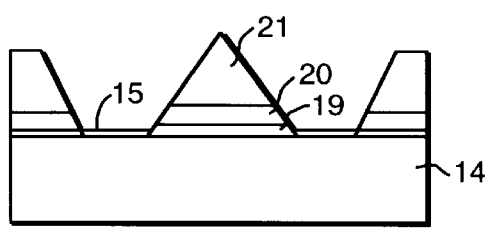
Figure 3D:
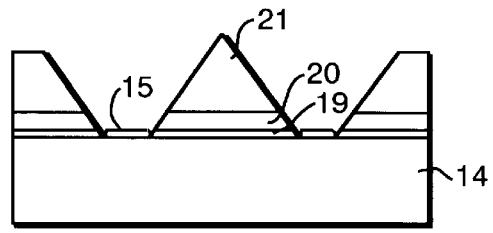
Figure 4:
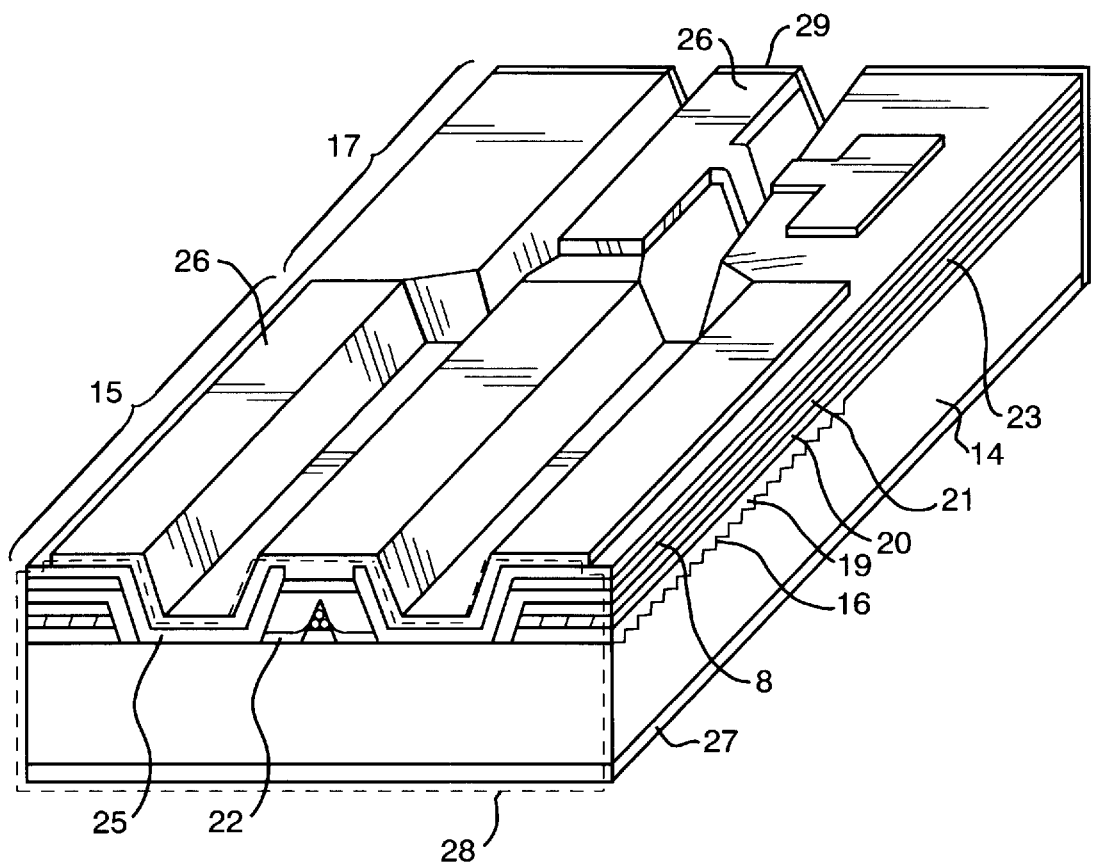
FIG. 4 is a perspective view of the semiconductor optical device in the second embodiment.
Figure 5A:
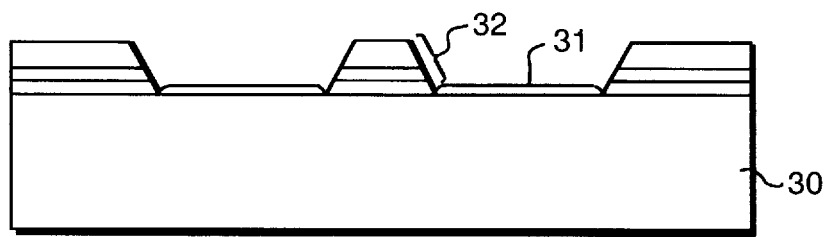
FIGS. 5A, 5B and 5C are sectional views for assistance in explaining a method of fabricating a prior art semiconductor electro-absorption type optical modulator.
Figure 5B:
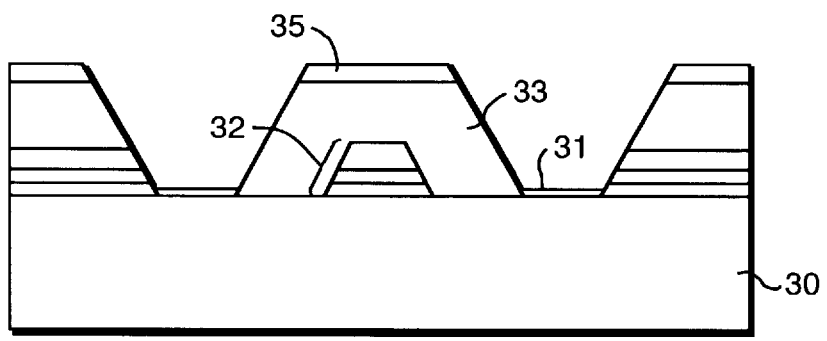
Figure 5C:
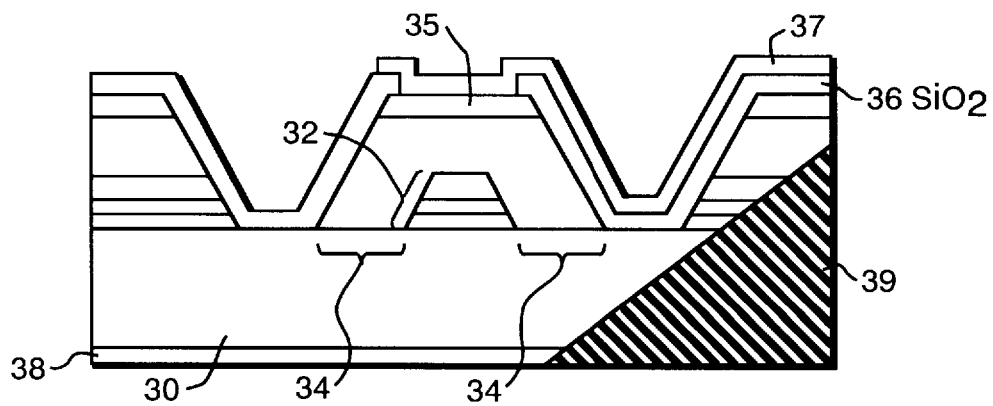

Then, as shown in FIG. 3B (the side view), FIG. 3C (a sectional view taken on line A–A' in FIG. 3B), and FIG. 3D (a sectional view taken on line B–B' in FIG. 3B), a 0.1 μm thick n-type InGaAsP waveguide layer 19 having a 1.13 μm wavelength composition and $5 \times 10^{17}$ cm$^{-3}$ carrier concentration, a seven-period multiple quantum well layer 20 consisting of undoped InGaAs well layers having 1.56 μm bandgap wavelength composition in the laser section 15 and InGaAsP barrier layers having 1.15 μm wavelength composition and a p-type InP cladding layer 21 of $1\times10^{17}$ cm$^{-3}$ carrier concentration are grown by MOVPE growth processes at a growth pressure of 75 torr and a growth temperature of 625° C. to form a DH layer. The growth of the cladding layer 21 is continued until the cladding layer 21 is formed in a triangular cross section. Since virtually no film grows on the (111)B surface of the p-type InP cladding layer 21, the growth of the p-type InP cladding layer 21 stops when the cross section of the p-type cladding layer 21 attains a triangular shape. Accordingly, the cladding layer 21 is formed in a triangular cross section in both the laser section 15 and the modulator section 17, but at different growth rates.

Figure 3E:
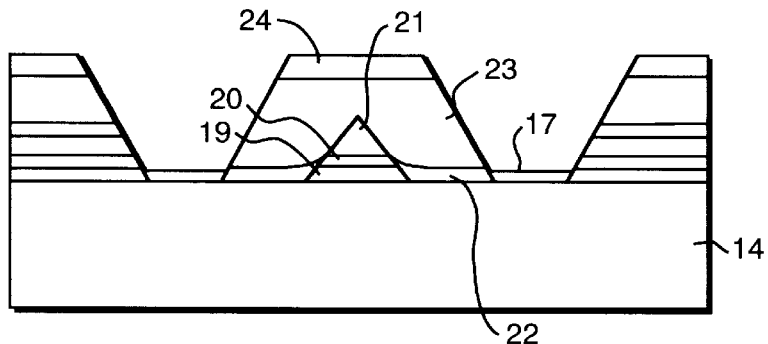

Next, as shown in FIG. 3E, portions of the masking stripes 18 are removed to increase the distance between the masking stripes 18 by 7 μm using an ordinary photolithographic wet etching process. Then, MOVPE growth processes are carried out to grow a 0.3 μm thick i-type InP layer 22, a 1.8 μm thick p-type InP burying layer 23 having a $5\times10^{17}$ cm$^{-3}$ carrier concentration, and a 0.3 μm thick p-type InGaAs contact layer 24 having a $5\times10^{18}$ cm$^{-3}$ carrier concentration.

Then, a 350 nm thick silicon oxide film 25 is formed by a thermal CVD process to cover the entire surface of the workpiece. A contact opening is formed in the silicon oxide film 25 by an ordinary photolithographic wet etching process, a 100 nm thick Ti film and a 300 nm thick Au film are deposited by sputtering processes, and then the Ti and the Au, film are processed by an ordinary photolithographic wet etching process to form a p-side electrode 26. Then, the back side of the substrate 14 is lap polished to adjust the thickness of the substrate 14 to 100 μm, a 100 nm thick Ti film and a 300 nm thick Au film are deposited on the back surface of the substrate 14 by sputtering processes to form an n-side electrode 27, and then the workpiece is sintered at 430° C. in a nitrogen atmosphere. Then, the workpiece is cleaved at its center, a highly reflective film 28 made of silicon nitride is sputter deposited on the laser section side facet and an anti-reflective film 29 made of silicon nitride is sputter deposited on the modulator side facet to complete a semiconductor optical device shown in FIG. 4. The optical output was 8 mW at 100 mA operating current for a laser with a lasing threshold of 10 mA. The capacitance of the pn junction between the burying layer 23 and the substrate 14 in the modulator section 17 was 2 pF. The waveform of the modulation output provided by modulation at 2.4 Gbps was satisfactory.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A semiconductor electro-absorption type optical modulator comprising:

a substrate having a first conductivity type;

a light-absorbing layer selectively formed on a stripe region of a main surface of said substrate;

a first burying layer formed adjacent to said light-absorbing layer to sandwich said light-absorbing layer from both sides of said stripe region; and a second burying layer having a second conductivity type different from said first conductivity type and formed on said first burying layer, said first burying layer having an impurity concentration lower than said substrate and said second burying layer.

2. The semiconductor electro-absorption type optical modulator as defined in claim 1, wherein said first burying layer is of an undoped semiconductor material.

3. The semiconductor electro-absorption type optical modulator as defined in claim 1, wherein said substrate is made of InP having said first conductivity type, said first burying layer is made of an undoped InP and said second burying layer is made of InP having said second conductivity type.

4. The semiconductor electro-absorption type optical modulator as defined in claim 1, wherein said substrate is a semiconductor material having a first conductivity type, said first burying layer is an undoped semiconductor material and said second burying layer is a second conductivity type semiconductor material so that said second burying layer, said first burying layer and said substrate collectively form a p-i-n diode structure.

5. The semiconductor electro-absorption type optical modulator as defined in claim 1, wherein said substrate is a semiconductor material having a first conductivity type, said light-absorbing layer is interposed between a first cladding layer of a first conductivity type formed on said substrate and a second cladding layer of a second conductivity type formed on said light-absorbing layer, and said first burying layer is an undoped semiconductor material and said second burying layer is a second conductivity type semiconductor material so that said second burying layer, said first burying layer and said substrate collectively form a p-i-n diode structure.

6. The semiconductor electro-absorption type optical modulator as defined in claim 1, wherein said substrate is a semiconductor material having a first conductivity type, said light-absorbing layer is interposed between a first cladding layer of a first conductivity type formed on said substrate and a second cladding layer formed on said light-absorbing layer and having a triangular cross section and a second conductivity type, and said first burying layer is an undoped semiconductor material and said second burying layer is a second conductivity type semiconductor material so that said second burying layer, said first burying layer and said substrate collectively form a p-i-n diode structure.

7. A semiconductor optical device consisting of a monolithically integrated electro absorption type optical modulator and a laser comprising:

a substrate having a first conductivity type;

a light-absorbing layer selectively formed on a stripe region of a main surface of said substrate;

a light-emitting layer formed contiguously with said light-absorbing layer on a stripe region of said main surface of said substrate;

a first burying layer formed adjacent to said light-absorbing layer and said light-emitting layer to sandwich said light-absorbing layer and said light-emitting layer from both sides of said stripe region; and a second burying layer having a second conductivity type different from said first conductivity type and formed on said first burying layer, said first burying layer having an impurity concentration lower than said substrate and said second burying layer.

8. The semiconductor optical device as defined in claim 7, wherein said first burying layer is of an undoped semiconductor material.

9. The semiconductor optical device as defined in claim 7, wherein said substrate is made of InP having said first conductivity type, said first burying layer is made of an undoped InP, and said second burying layer is made of InP having said second conductivity type.

10. The semiconductor optical device as defined in claim 7, wherein said substrate is a semiconductor material having a fist conductivity type, said first burying layer is an undoped semiconductor material and said second burying layer is a second conductivity type semiconductor material so that said second burying layer, said first burying layer and said substrate collectively form a p-i-n diode structure.

11. The semiconductor optical device as defined in claim 7, wherein said substrate is a semiconductor material having a first conductivity type, said light-absorbing layer and said light-emitting layer are interposed between a waveguide layer of a first conductivity type formed on said substrate and a cladding layer of a second conductivity type formed on said light-absorbing layer and said light-emitting layer, and said first burying layer is an undoped semiconductor material and said second burying layer is a second conductivity type semiconductor material so that said second burying layer, said first burying layer and said substrate collectively form a p-i-n diode structure.

12. The semiconductor optical device as defined in claim 7, wherein said substrate is a semiconductor material having a first conductivity type, said light-absorbing layer and said light-emitting layer are interposed between a waveguide layer of a first conductivity type formed on said substrate and a cladding layer formed on said light-absorbing layer and said light-emitting layer and having a second conductivity type and a triangular cross section, and said first burying layer is an undoped semiconductor material and said second burying layer is a second conductivity type semiconductor material so that said second burying layer, said first burying layer and said substrate collectively form a p-i-n diode structure.

\* \* \* \* \*